(12) United States Patent
Ali et al.

(10) Patent No.: US 12,745,341 B1
(45) Date of Patent: Sep. 22, 2026

(54) DOUBLE-SIDED COATED FLAT EMITTER WITH A CONE-SHAPED REFLECTOR FOR PASSIVE RADIATIVE COOLING IN COMPACT ELECTRONICS

(71) Applicant: King Fahd University of Petroleum and Minerals, Dhahran (SA)

(72) Inventors: Hafiz Muhammad Ali, Dhahran (SA); Qamar Abbas, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 19/391,836

(22) Filed: Nov. 17, 2025

(51) Int. Cl.
*H05K 1/00* (2006.01)
*H05K 1/02* (2006.01)

(52) U.S. Cl.
CPC .................................. *H05K 1/0201* (2013.01)

(58) Field of Classification Search
CPC ........... H05K 7/20427; H05K 7/20245; H05K 7/20781; H05K 7/20818
See application file for complete search history.

(56) References Cited

U.S. PATENT DOCUMENTS 8,707,947 B2 4/2014 Hollis et al.
10,508,838 B2 12/2019 Chen et al.
2015/0338175 A1* 11/2015 Raman .................... B60H 1/32 165/185
2016/0363394 A1* 12/2016 Liu ......................... F28F 13/18
2018/0059318 A1* 3/2018 Nichol ................. G02B 6/0043
2021/0254869 A1 8/2021 Gan et al.

FOREIGN PATENT DOCUMENTS

WO WO 2023/167639 A1 9/2023

OTHER PUBLICATIONS

FuQiang Wang, et al., "A double-layer radiative cooling coating that utilizes the refractive index difference between layers to achieve extremely high solar reflectivity", Science China Technological Sciences, vol. 67, No. 10, Oct. 2024 (published online Sep. 10, 2024), pp. 3182-3189.

* cited by examiner

*Primary Examiner* — Pete T Lee
(74) *Attorney, Agent, or Firm* — Oblon, McClelland, Maier & Neustadt, L.L.P.

(57) ABSTRACT

A passive radiative cooling system and a method of making a passive radiative cooling system includes a thermally insulated box having walls and a floor, wherein an inner surface of the walls and the floor are coated with a reflective tape. A cone-shaped aluminum reflector is located within an inner cavity of the thermally insulated box and is attached to the floor with a central axis coincident with a central axis of the thermally insulated box. At least one electronic circuit is directly printed on or attached to a polished aluminum substrate, which is then coated with polydimethylsiloxane (PDMS) to form a polydimethylsiloxane (PDMS)-coated aluminum double-sided flat thermal emitter, which is placed vertically within the cone-shaped aluminum reflector with its vertical axis coincident with the central axis of the cone-shaped aluminum reflector. A transparent polyethylene sheet covers a top opening of the thermally insulated box.

20 Claims, 12 Drawing Sheets

100
90
80
70
60
50
40
30
20
10
0
Relative Humidity (%)
Nov. 29, 2024
Nov. 30, 2024
17:00
19:00
21:00
23:00
01:00
03:00
05:00
Time (hh:mm)

DOUBLE-SIDED COATED FLAT EMITTER WITH A CONE-SHAPED REFLECTOR FOR PASSIVE RADIATIVE COOLING IN COMPACT ELECTRONICS

CROSS REFERENCE TO RELATED APPLICATIONS

The present application is related to "Double-Sided Coated Zigzag Shaped Emitter With A Cone-Shaped Reflector For Passive Radiative Cooling Of Electronics", Pat. No. 19/392,000 filed on Nov. 17, 2025 and to "Horizontal Flat-Surface Radiative Cooling Design With A V-Shaped Reflector For Enhanced Thermal Management Of Electronics", Pat. No. 19/392,000 , filed on Nov. 17, 2025 and to "System and Methods for Thermal Management of Electronic Devices in a Passive Radiative Cooling Enclosure Utilizing a Cylindrical Emitter and a Cone-Shaped Reflector", Pat. No. 19/392,119 filed on Nov. 17, 2025, which are each incorporated by reference herein in their entirety.

BACKGROUND

Technical Field

The present disclosure is directed to a passive cooling system, more particularly a passive radiative cooling system for cooling printed electronic circuits to enhance energy efficiency, reliability, and longevity of compact electronic components.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Efficient thermal management is a fundamental requirement in modern electronics, directly impacting device reliability, performance, and safety. As electronic systems become increasingly compact and powerful, they generate greater heat densities, intensifying the challenge of maintaining optimal operating temperatures. Inadequate heat dissipation leads to elevated internal temperatures, resulting in thermal degradation of components, reduced efficiency, and premature failure. Heat-related issues account for over 55% of electronic component failures, making thermal control a critical priority in device design and operation.

This challenge becomes particularly acute in optoelectronic systems and energy-conversion devices, where thermal buildup directly compromises functional efficiency and lifespan. For instance, silicon-based photovoltaic cells can exceed 65° C. under direct sunlight, experiencing an efficiency drop of approximately 0.4-0.5% per ° C. of temperature rise. Similarly, high-rate charging of lithium-ion batteries in mobile devices can elevate temperatures to 75° C., posing significant risks to both performance and user safety. With the global shift toward miniaturized, high-performance electronics, traditional cooling methods, including fans, heat sinks, or active liquid cooling system, struggle to meet these emerging demands due to their bulk, energy consumption, and design limitations.

Passive radiative cooling offers a promising alternative by enabling heat dissipation without external energy input. This approach harnesses the natural ability of surfaces to emit thermal radiation into the cooler environment of outer space through the atmospheric transparency window in the mid-infrared range (8 μm-13 μm). By tailoring surface emissivity and reflectivity, a radiative cooling system can reduce device temperatures even under direct sunlight. Conventional devices utilize complex photonic structures, multilayer coatings, and metamaterials to achieve selective emission within the atmospheric transparency window, demonstrating effective cooling performance under high solar irradiance conditions.

However, these advances present significant limitations. Cooling performance in such systems requires emission to be precisely restricted to the transparency window. While effective for high-performance applications this constraint necessitates complex fabrication processes, high production costs, and limited scalability. Furthermore, existing solutions often lack adaptability to varying heat flux conditions and geometric constraints imposed by diverse electronic devices, thereby restricting their effectiveness and applicability across a broad range of practical implementations. Simpler materials, such as polydimethylsiloxane (PDMS) and glass, offer strong mid-infrared emissivity and visible transparency yet their potential for simplifying radiative cooling systems while retaining adequate performance for many practical applications remains unexploited.

US20210254869A1 describes a passive cooler including a thermal emitter made from a metal coated with polydimethylsiloxane. Reflective V shaped beam guides are placed at an angle on either side of the emitter. A transparent cover made of polyethylene film covers the cooler. The thermal emitter is placed vertically so that each flat face projects thermal radiation toward the beam guides. Unlike the present disclosure, the thermal emitter is configured to cool a reservoir of liquid nitrogen, and there is no mention of cooling printed electronic devices printed on or attached to the thermal emitter.

U.S. Ser. No. 10/508,838B2 describes a radiative cooler that includes an emitter enclosed in a vacuum housing below a radiative cone and does not include integrated printed circuits.

Each of the aforementioned references suffers from one or more drawbacks including the need for a vacuum chamber or the emitter including directly printed or attached electronic devices. Accordingly, the present disclosure addresses these limitations by providing a passive radiative cooling system designed specifically for cooling printed electronic circuits. The system enhances energy efficiency and device reliability through effective passive radiative cooling while overcoming the complexity and cost barriers associated with the existing photonic structures. This is achieved by utilizing readily available materials and innovative geometric designs that enable efficient heat dissipation in compact electronics operating under moderate heat flux conditions. The disclosure extends device lifespan, improves performance, and supports sustainability goals through a practical, scalable cooling solution accessible to a broader range of applications.

SUMMARY

A passive radiative cooling system for cooling printed electronic circuits is described comprising; a thermally insulated box having walls and a floor, wherein an inner surface of the walls and the floor are coated with a reflective tape; a cone-shaped aluminum reflector located within an inner cavity of the thermally insulated box, wherein the cone-shaped aluminum reflector is attached to the floor and has a central axis coincident with a central axis of the thermally insulated box; a polydimethylsiloxane (PDMS)-coated aluminum double-sided flat thermal emitter placed vertically within the cone-shaped aluminum reflector, wherein a vertical axis of the PDMS-coated aluminum double-sided flat thermal emitter is coincident with the central axis of the cone-shaped aluminum reflector; at least one printed electronic circuit directly printed on or attached to a polished aluminum substrate of the PDMS-coated aluminum double-sided flat thermal emitter and a transparent polyethylene sheet configured to cover a top opening of the thermally insulated box.

A method of making a passive radiative cooling system for cooling at least one printed electronic circuit is described, comprising; coating an inner surface of walls and a floor of a thermally insulated box with a reflective tape; attaching a cone-shaped aluminum reflector located within an inner cavity of the thermally insulated box to the floor with a central axis of the cone-shaped aluminum reflector coincident with a central axis of the thermally insulated box; directly printing or attaching the at least one printed electronic circuit on a polished aluminum substrate; forming a polydimethylsiloxane (PDMS)-coated aluminum double-sided flat thermal emitter by coating the polished aluminum substrate with a PDMS layer; placing the PDMS-coated aluminum double-sided flat thermal emitter vertically within the cone-shaped aluminum reflector, wherein a vertical axis of the PDMS-coated aluminum double-sided flat thermal emitter is coincident with the central axis of the cone-shaped aluminum reflector; and covering a top opening of the thermally insulated box with a transparent polyethylene sheet.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
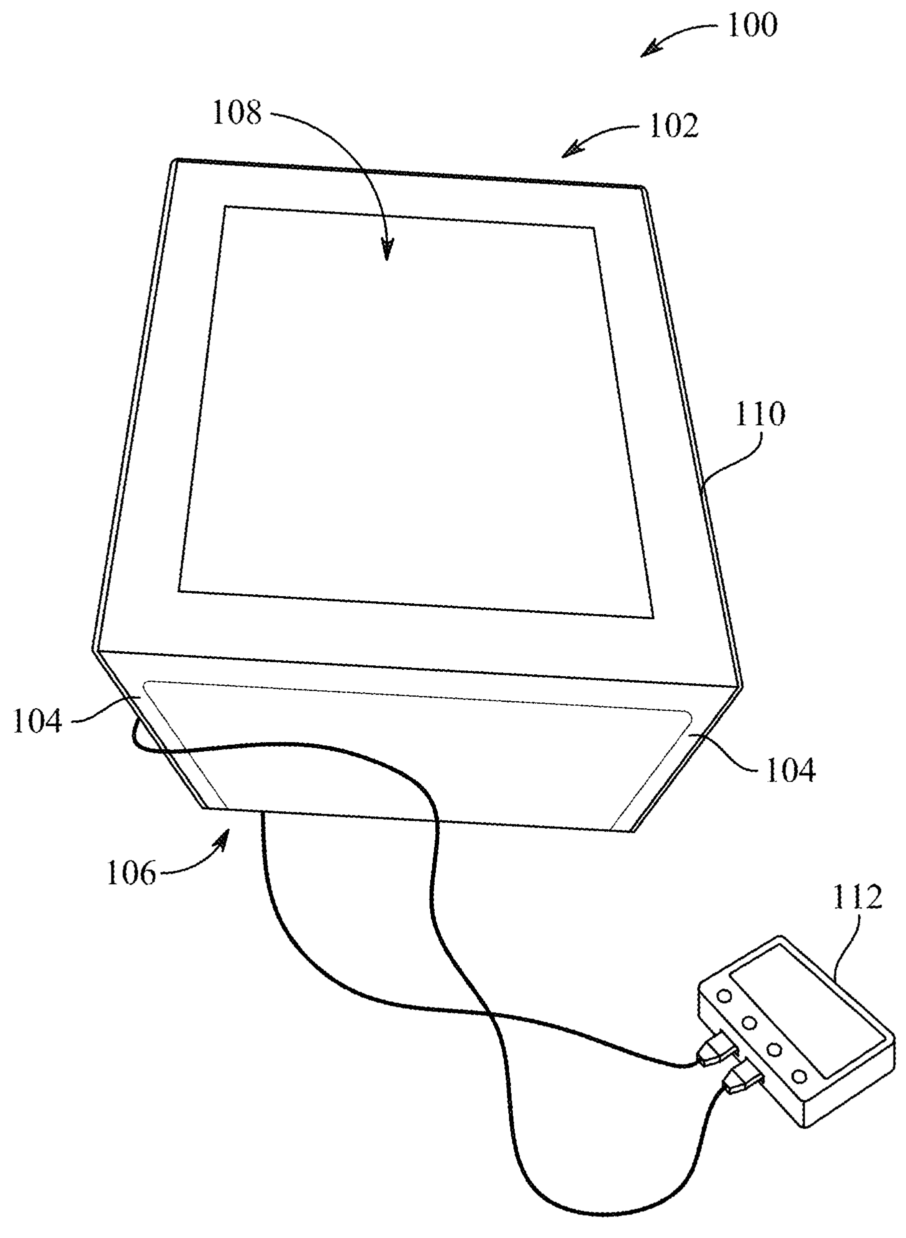
FIG. 1 is a schematic diagram of a perspective view of a passive radiative cooling system, according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of this disclosure are directed to a passive radiative cooling system for cooling at least one printed electronic circuit. The passive radiative cooling system includes multiple interconnected components that work together to dissipate heat without requiring external power input. A transparent sheet is designed with air gaps that facilitate heat transfer while minimizing conductive losses. This integrated design provides effective passive cooling in a scalable, cost-effective architecture suitable for various electronic devices, including photovoltaic cells, battery systems, and consumer electronic devices.

Referring to FIG. 1, illustrated is a schematic diagram of a perspective view of a passive radiative cooling system 100. The passive radiative cooling system 100 refers to a structure designed to dissipate heat from enclosed electronic components through a radiative process. The passive radiative cooling system 100 includes a thermally emissive surface and radiative materials to transfer thermal energy to the environment, thereby lowering internal temperature without need for an active cooling mechanism. The passive radiative cooling system 100 is configured to reduce its internal temperatures without active energy input.

The passive radiative cooling system 100 includes a thermally insulated box 102 having walls 104 and a floor 106. An inner surface 108 of the walls 104 and the floor 106 is coated with a reflective tape 110. The thermally insulated box 102 is designed to maintain a cooler internal temperature through radiative heat dissipation. The reflective tape 110 may be adhesively bonded or mechanically affixed to the inner surface 108 to form a continuous layer for thermal reflectivity. The reflective tape 110 may also be affixed to the outer walls of the thermally insulated box 102 to reflect sunlight away from the outer surface.

In operation, the reflective tape 110 may be configured to redirect infrared radiation away from the passive radiative cooling system 100. By reflecting incident thermal energy and minimizing absorption, the passive radiative cooling system 100 passively radiates heat outward, thereby lowering the internal temperature. The passive radiative cooling system 100 provides efficient cooling in environments where active cooling systems are impractical or energy intensive.

In an aspect, two thermocouples (not shown in the figure) are positioned on inner and outer surfaces of the passive radiative cooling system 100 to measure temperature variations during operation. The thermocouples are electrically connected to a data logger 112 that continuously records temperature data throughout nocturnal testing periods, enabling real-time monitoring and performance evaluation of the passive radiative cooling system 100.

Further, ambient weather conditions, such as temperature, humidity, and solar irradiance, may be concurrently monitored by a weather station communicatively coupled to the passive radiative cooler 100.

Figure 2A:
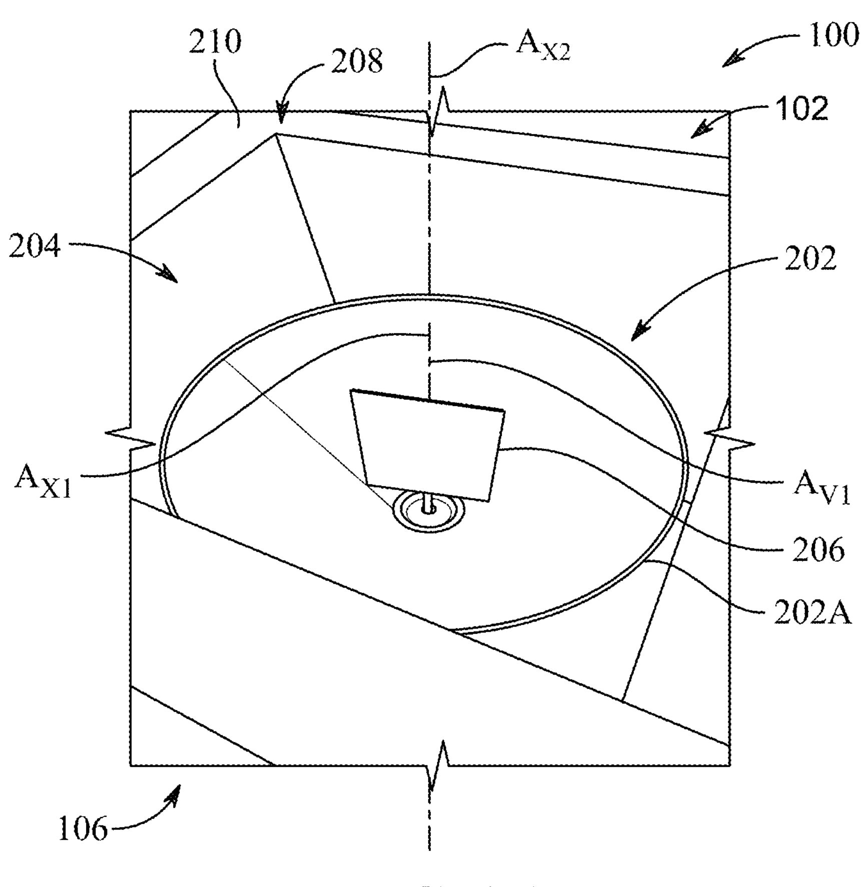
FIG. 2A is a schematic diagram of a top view of the passive radiative cooling system, according to certain embodiments.

Referring to FIG. 2A, illustrated is a schematic diagram of a top view of the passive radiative cooling system 100. The passive radiative cooling system 100 further includes a cone-shaped aluminum reflector 202 located within an inner cavity 204 of the thermally insulated box 102. The cone-shaped aluminum reflector 202 is attached to the floor 106 and has a central axis $A_{x1}$ coincident with a central axis $A_{x2}$ of the thermally insulated box 102.

The cone-shaped aluminum reflector 202 refers to a thermally reflective structure that has a conical geometry designed to redirect thermal radiation. The cone-shaped aluminum reflector 202 is positioned within the inner cavity 204 and is rigidly attached to the floor 106 to provide a durable and fixed positioning within the thermally insulated box 102. The attachment of the cone-shaped aluminum reflector 202 is structured such that the central axis a of the cone-shaped aluminum reflector 202 is coincident with the central axis $A_{x2}$ of the thermally insulated box 102. This coaxial arrangement provides symmetrical alignment for directional radiation reflection. The cone-shaped aluminum reflector 202 contributes to enhancing radiative cooling performance by directing thermal energy outward from the passive radiative cooling system 100.

The passive radiative cooling system 100 further includes a polydimethylsiloxane (PDMS)-coated aluminum double-sided flat thermal emitter 206 placed vertically within the cone-shaped aluminum reflector 202. A vertical axis $A_{v1}$ of the PDMS-coated aluminum double-sided flat thermal emitter 206 is coincident with the central axis $A_{x1}$ of the cone-shaped aluminum reflector 202.

In an aspect, the effective surface area of the PDMS-coated aluminum double-sided flat thermal emitter 206 facilitates emission and promotes angular selectivity for mid-infrared wavelengths. The PDMS-coated aluminum double-sided flat thermal emitter 206 contributes to spectral selectivity by enhancing thermal emissivity in the atmospheric transparency window, which has a radiative wavelength in a range of about 8 μm to about 13 μm. The passive radiative cooling system 100 is suitable for thermal management in compact, low-power electronic applications under direct exposure to sky conditions.

In an exemplary aspect, the PDMS-coated aluminum double-sided flat thermal emitter 206 may have a 180° reflective view factor to provide efficient thermal radiation and uniform heat distribution. The PDMS-coated aluminum double-sided flat thermal emitter 206 may be designed for cooling electronics with heat fluxes below 280 $W/m^2$ to manage heat in compact devices.

The PDMS-coated aluminum double-sided flat thermal emitter 206 is configured to emit heat within the wavelength of the atmospheric transparency window, wherein the radiative wavelength is in a range of about 8 μm to about 13 μm. The atmospheric window refers to a region of the electromagnetic spectrum that may pass through the atmosphere of earth. The optical, infrared, and radio windows form three main atmospheric windows. The atmospheric window allows electromagnetic energy from the sun to reach the surface of the earth and permits thermal radiation emitted from the surface of the earth to escape directly into outer space. The windows are themselves dependent upon clouds, water vapor, trace greenhouse gases, and other components of the atmosphere.

The passive radiative cooling system 100 further includes a transparent polyethylene sheet 208 configured to cover a top opening 210 of the thermally insulated box 102. The transparent polyethylene sheet 208 is configured to transmit mid-infrared thermal radiation emitted from internal components while minimizing convective heat gain from the surrounding environment.

In an aspect, the passive radiative cooling system 100 is configured to reduce a temperature within the thermally insulated box 102 by an average of about 10 degrees Celsius below an ambient temperature which surrounds the thermally insulated box 102. This temperature reduction is achieved through a combination of radiative heat loss to the cold sky and minimized heat gain from external sources. The passive radiative cooling system 100 integrates reflective and emissive components that promote thermal radiation while suppressing conduction and convection, thereby maintaining a cooler internal environment without active cooling systems.

Figure 2B:
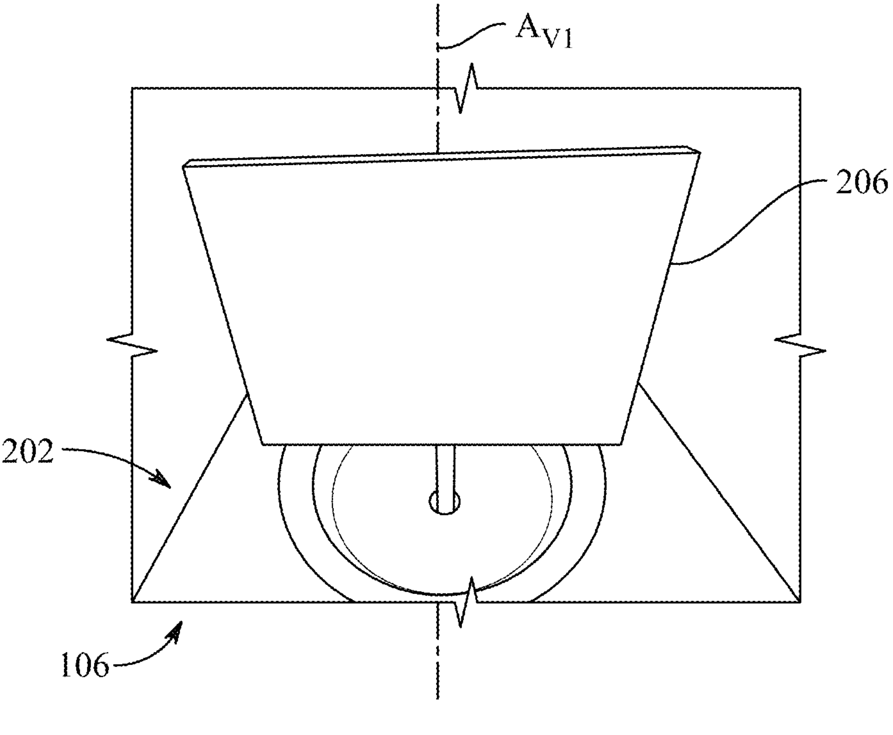
FIG. 2B is a schematic diagram of a front perspective view of a PDMS-coated aluminum double-sided flat thermal emitter, according to certain embodiments.

Referring to FIG. 2B, illustrated is a schematic diagram of a front perspective view of the PDMS-coated aluminum double-sided flat thermal emitter 206. The PDMS-coated aluminum double-sided flat thermal emitter 206 is attached to the floor 106 by a high-temperature silicone adhesive. The high-temperature silicone adhesive provides robust bonding and maintains structural integrity under thermal cycling and ensures that the PDMS-coated aluminum double-sided flat thermal emitter 206 remains consistently positioned during operation.

Figure 2C:
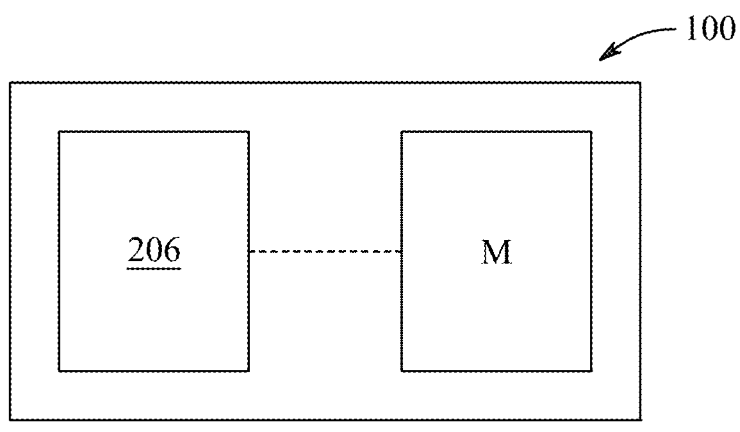
FIG. 2C is a schematic block diagram showing the PDMS-coated aluminum double-sided flat thermal emitter connected to a motor, according to certain embodiments.

Referring to FIG. 2C, illustrated is a schematic block diagram showing the PDMS-coated aluminum double-sided flat thermal emitter 206 connected to a motor M.

The passive radiative cooling system 100 may include the motor 'M'. The motor 'M' is configured to rotate the PDMS-coated aluminum double-sided flat thermal emitter 206 within the cone-shaped aluminum reflector 202. The motor housing of the motor 'M' is placed outside of the thermally insulated box 102 on a bottom surface, with only the motor shaft entering into the thermally insulated box 102 to prevent heating from the operation of the motor 'M'. The rotation of the PDMS-coated aluminum double-sided flat thermal emitter 206 distributes the radiated thermal energy evenly across an inner surface of the cone-shaped aluminum reflector 202. This rotational movement further prevents localized overheating at any single contact point on the cone-shaped aluminum reflector 202 and ensures uniform thermal distribution throughout the inner surface of the cone-shaped aluminum reflector 202. The rotation of the motor 'M' improves the overall radiative cooling performance of the passive radiative cooling system 100.

In an aspect, the motor 'M' may include, but not limited to DC motors, stepper motors, servo motors, or brushless motors, depending on the specific rotational speed and torque requirements of the passive radiative cooling system 100. The rotation of the motor 'M' improves the overall radiative cooling performance of the passive radiative cooling system 100.

Figure 3A:
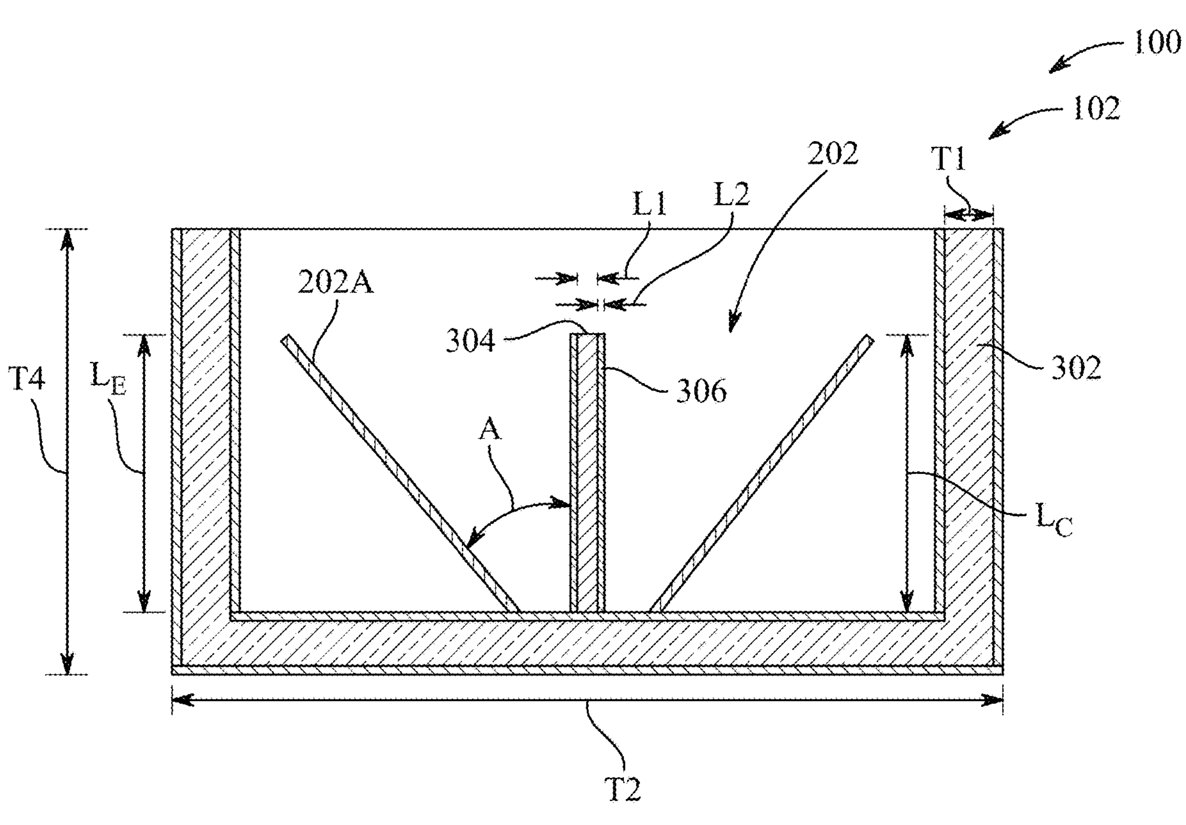
FIG. 3A is a schematic diagram of a cross-sectional view of the passive radiative cooling system, according to certain embodiments.

Referring to FIG. 3A, illustrated is a schematic diagram of a cross-sectional view of the passive radiative cooling system 100. The thermally insulated box 102 is made from polystyrene foam 302 and has a thickness 'T1' of about 10 mm. The thermally insulated box 102 has a rectangular cuboid shape with dimensions of about 500 mm by about 400 mm by about 300 mm and includes an open top end. The thermally insulated box 102 has a length 'T2', a width 'T3' (shown in FIG. 3C), and a height 'T4'.

In an aspect, a frustum angle 'A' of the cone-shaped aluminum reflector 202 is about 45 degrees. The frustum angle 'A' is configured to facilitate redirection and reflection of incident thermal radiation toward the intended emission pathway and improve the overall radiative cooling efficiency of the passive radiative cooling system 100. The frustum geometry of the cone-shaped aluminum reflector 202 with a 45 degree angle further enables ease of assembly and reliability of the PDMS-coated aluminum double-sided flat thermal emitter 206 within the passive radiative cooling system 100.

In an aspect, a length '$L_E$' of the PDMS-coated aluminum double-sided flat thermal emitter 206 is equal to a height '$L_C$' of the cone-shaped aluminum reflector 202 as measured from the floor 106 of the thermally insulated box 102 to an upper rim 202A of the cone-shaped aluminum reflector 202. The PDMS-coated aluminum double-sided flat thermal emitter 206 is characterized by a flat shape having a thickness 'L1' of about 0.5 mm. The flat geometry provides a smooth, even surface that maximizes the effective radiating area while maintaining structural rigidity and uniform heat distribution across the surface of the PDMS-coated aluminum double-sided flat thermal emitter 206.

This dimensional correspondence ensures that the PDMS-coated aluminum double-sided flat thermal emitter 206 is positioned to maximize radiative heat transfer through the atmospheric transparency window while maintaining alignment with the reflective surfaces.

In an aspect, when the passive radiative cooling system 100 is exposed to the open sky, the passive radiative cooling system 100 interacts with its surroundings by exchanging thermal radiation with the atmosphere, which may be influenced by the ambient air temperature (Tam), and by solar radiation during daylight hours.

Figure 3B:
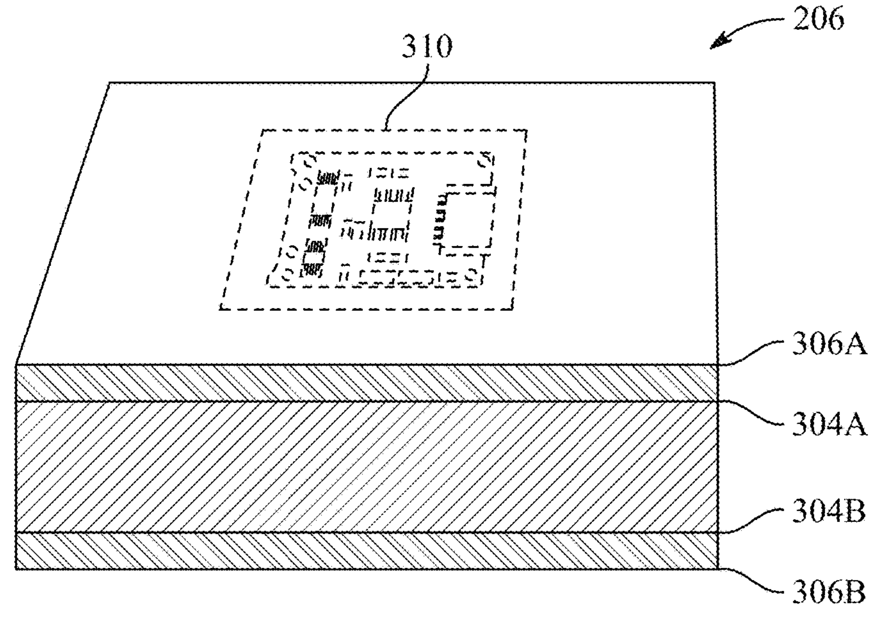
FIG. 3B is a schematic diagram of a top perspective view of the PDMS-coated aluminum double-sided flat thermal emitter, according to certain embodiments.

Referring to FIG. 3B, illustrated is a schematic diagram of a top perspective view of the PDMS-coated aluminum double-sided flat thermal emitter 206. At least one printed electronic circuit 310 is directly printed on or attached to the polished aluminum substrate 304 of the PDMS-coated aluminum double-sided flat thermal emitter 206.

The PDMS-coated aluminum double-sided flat thermal emitter 206 is fabricated from the polished aluminum substrate 304 coated with a PDMS layer 306 on each of a first side 304A and a second side 304B. The polished aluminum substrate 304 is about 0.5 mm in thickness 'L1'. The polished aluminum substrate 304 is a high-reflectivity material, while the PDMS layer 306 facilitates efficient thermal emission to the surrounding environment. The PDMS-coated aluminum double-sided flat thermal emitter 206 is mounted within the thermally insulated box 102 with the first side 304A and the second side 304B facing the cone-shaped aluminum reflector 202. This flat shaped configuration is designed to maximize thermal radiation exchange between the PDMS-coated aluminum double-sided flat thermal emitter 206 and the cone-shaped aluminum reflector 202, thereby enhancing the efficiency of the passive radiative cooling system 100.

In an aspect, a first PDMS layer 306A is coated on the first side 304A of the polished aluminum substrate 304. The first PDMS layer 306A is about 120 microns thick 'L1'. The first PDMS layer 306A is cured on the first side 304A for about 60 minutes at 100 degrees Celsius. A second PDMS layer 306B is coated on the second side 304B of the polished aluminum substrate 304. The second PDMS layer 306B is about 120 microns thick 'L1'. The second PDMS layer 306B is cured on the second side 304B for about 60 minutes at 100 degrees Celsius.

The first PDMS layer 306A and the second PDMS layer 306B may be applied to the polished aluminum substrate 304 to achieve uniform surface coverage and strong adhesion. The thickness of the first PDMS layer 306A and the second PDMS layer 306B may be selected to balance emissivity and material durability. The curing of the first PDMS layer 306A on the first side 304A of the polished aluminum substrate 304 and the curing of the second PDMS layer 306B on the second side 304B of the polished aluminum substrate 304 promote crosslinking within the first PDMS layer 306A and the second PDMS layer 306B, resulting in a thermally stable and optically selective coating. The first PDMS layer 306A and the second PDMS layers 306B enhance mid-infrared emissivity while maintaining mechanical flexibility and resistance to environmental conditions.

In an aspect, the at least one printed electronic circuit 310 is directly printed on or attached to at least one of the first side 304A and the second side 304B of the polished aluminum substrate 304 before the PDMS layers are applied. The printed electronic circuit 310 may be printed using an additive manufacturing process including inkjet or screen printing on the polished aluminum substrate 304. The direct deposition of the printed electronic circuit 310 on the polished aluminum substrate 304 ensures precise electrical contact, mechanical stability, and efficient thermal management within the passive radiative cooling system 100.

Figure 3C:
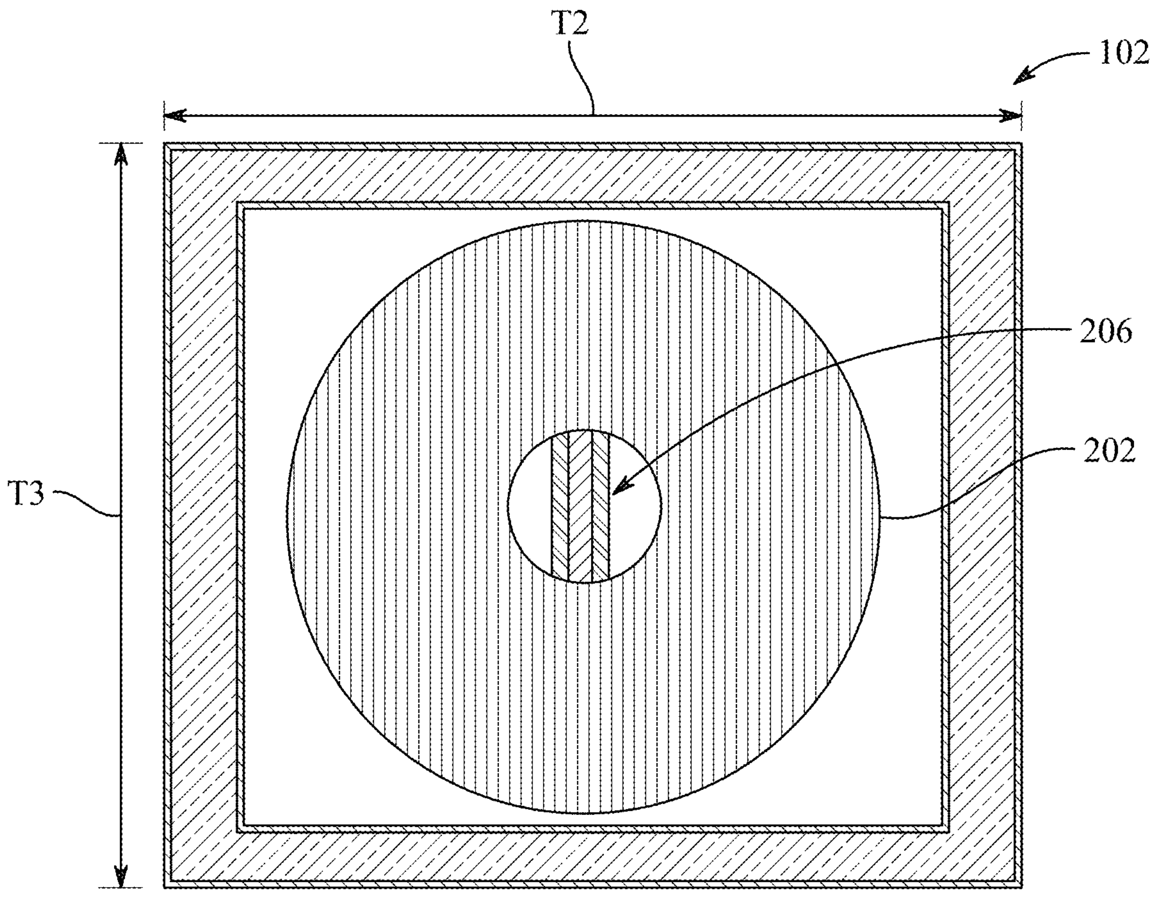
FIG. 3C is a schematic diagram of a top view of the passive radiative cooling system, according to certain embodiments.

Referring to FIG. 3C, illustrated is a schematic diagram of a top view of the passive radiative cooling system 100. The cone-shaped aluminum reflector 202 is positioned centrally within the thermally insulated box 102, and the PDMS-coated aluminum double-sided flat thermal emitter 206 is vertically oriented inside the cone-shaped aluminum reflector 202. The thermally insulated box 102 has the length 'T2', the width 'T3', and the height 'T4'.

Figure 4A:
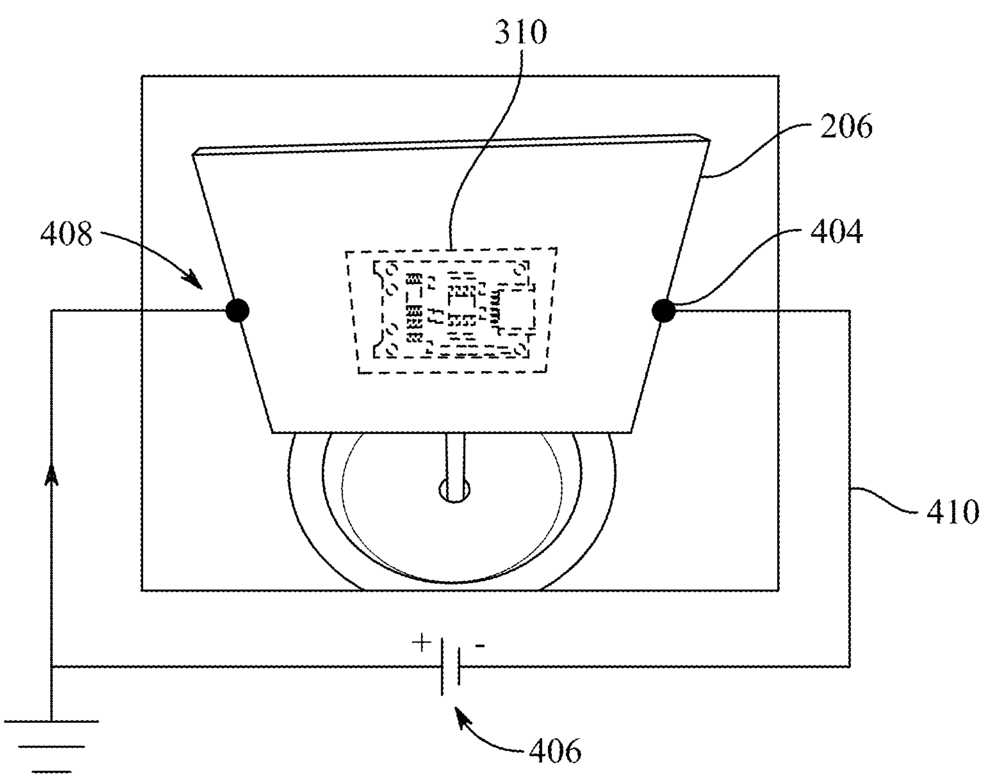
FIG. 4A is a schematic diagram of a front perspective view of the PDMS-coated aluminum double-sided flat thermal emitter showing at least one printed electronic circuit, according to certain embodiments.

Referring to FIG. 4A, illustrated is a schematic diagram of a front perspective view of the PDMS-coated aluminum double-sided flat thermal emitter 206 showing the at least one printed electronic circuit 310.

Each printed electronic circuit 310 includes at least one contact pad 404 configured for connection to at least one of a power source 406 and an input/output line. The at least one contact pad 404 facilitates reliable power delivery and signal transmission for operation, monitoring, or control of the passive radiative cooling system 100.

The passive radiative cooling system 100 further includes a plurality of vias 408 formed in each PDMS layer 306 to expose the at least one contact pad 404. The plurality of vias 408 refers to small holes or channels that are formed in each of the PDMS layer 306. The plurality of vias 408 provides electrical and thermal access pathways from the at least one electronic circuit 310 to the contact pads 404.

The passive radiative cooling system 100 further includes plurality of wiring 410 configured to connect each contact pad 404 to at least one of an external power source 406 and an external input/output controller. The plurality of wiring 410 efficiently transmits electrical power and signals between the printed electronic circuit 310 and the power source 406. The power source 406 is connected to the printed electronic circuit 310 via the plurality of wiring 410.

The PDMS-coated aluminum double-sided flat thermal emitter 206 is electrically connected to a ground reference. In one aspect, a dielectric layer may be deposited on a designated region of the surface of the PDMS-coated aluminum double-sided flat thermal emitter 206, where the printed electronic circuit 310 is to be formed. A copper sheet may be laid over the dielectric layer to provide an electrically conductive base. The printed electronic circuit 310 may be subsequently printed directly onto the copper sheet using conductive ink deposition techniques. Alternatively, the printed electronic circuit 310 may be printed directly onto the dielectric layer, with the copper sheet serving as an underlying ground plane. This direct printing ensures proper electrical grounding while maintaining thermal conductivity and structural integrity of the PDMS-coated aluminum double-sided flat thermal emitter 206.

Figure 4B:
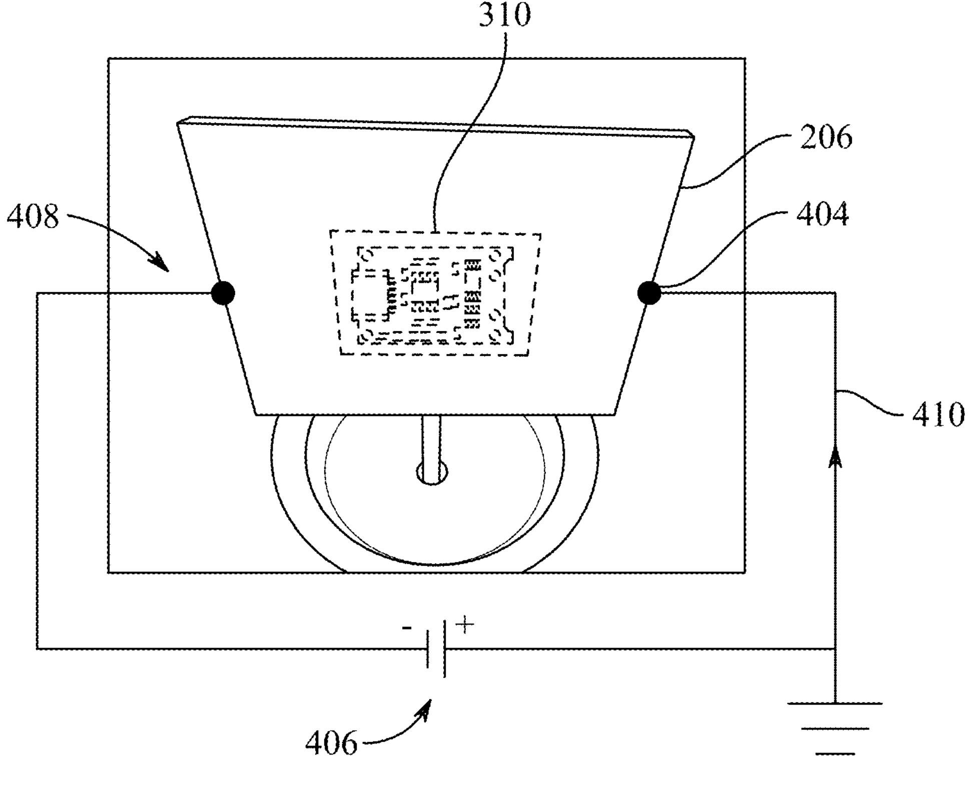
FIG. 4B is a schematic diagram of a rear perspective view of the PDMS-coated aluminum double-sided flat thermal emitter showing at least one printed electronic circuit, according to certain embodiments.

Referring to FIG. 4B, illustrated is a schematic diagram of a rear perspective view of the PDMS-coated aluminum double-sided flat thermal emitter 206. As shown in FIG. 4A, the printed electronic circuit 310 is directly printed on or attached to the rear side of the polished aluminum substrate 304 of the PDMS-coated aluminum double-sided flat thermal emitter 206 before the PDMS layer is applied.

Figure 4C:
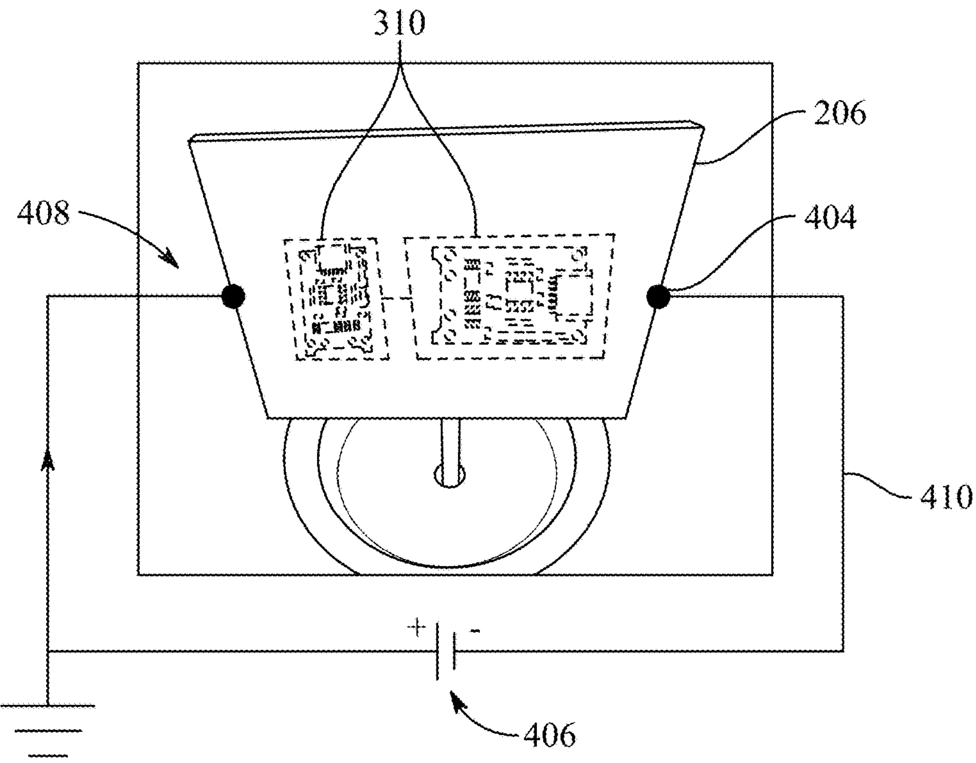
FIG. 4C is a schematic diagram of a perspective view of the PDMS-coated aluminum double-sided flat thermal emitter showing more than one printed electronic circuit, according to certain embodiments.

Referring to FIG. 4C, illustrated is a schematic diagram of a perspective view of the PDMS-coated aluminum double-sided flat thermal emitter 206 showing more than one printed electronic circuit 310. The printed electronic circuit 310 is attached to at least one of the first side 304A and the second side 304B of the polished aluminum substrate 304. In an example, the at least one printed electronic circuit 310 is attached to the polished aluminum substrate 304 with a thermal glue, such as is used to attach heat sinks to electronic components. The at least one contact pad 404 enables electrical connection to the at least one power source 406 and an input/output line.

Referring back to FIG. 3B, the first PDMS layer 306A is coated on the first side 304A of the polished aluminum substrate 304 over the at least one printed electronic circuit 310. The first PDMS layer 306A is about 120 microns thick. The first PDMS layer 306A is cured on the first side 304A for about 60 minutes at 100 degrees Celsius. The second PDMS layer 306B is coated on the second side 304B of the polished aluminum substrate 304 over one or more printed electronic circuits 310. The second PDMS layer 306B is about 120 microns thick. The second PDMS layer 306B is cured on the second side 304B for about 60 minutes at 100 degrees Celsius.

The application of the first PDMS layer 306A and the second PDMS layer 306B ensures proper adhesion and thermal stability. The PDMS layer 306 further facilitates thermal emission properties while providing electrical insulation and environmental protection for the polished aluminum substrate 304 and the printed electronic circuit 310.

In an aspect, the plurality of vias 408 are formed in each PDMS layer 306 to expose the one contact pad 404. The plurality of wiring 410 is configured to connect each contact pad 404 to at least one of an external power source 406 and an external input/output controller. The plurality of wiring 410 is configured to establish electrical connections between each contact pad 404 and at least one of an external power source 406 and an external input/output controller.

In one aspect, a plurality of electronic circuits is printed on the front and rear sides of the PDMS-coated aluminum double-sided flat thermal emitter 206. This dual-sided printing on the PDMS-coated aluminum double-sided flat thermal emitter 206 enables simultaneous temperature measurement from both surfaces while maintaining the radiative cooling efficiency and thermal emission characteristics of the PDMS-coated aluminum double-sided flat thermal emitter 206.

In another aspect, a plurality of flexible printed circuits may be attached to the front and rear sides of the PDMS-coated aluminum double-sided flat thermal emitter 206. The flexible configuration may facilitate integration of temperature sensors and electrical interconnections without compromising the structural integrity or thermal emission properties of the PDMS-coated aluminum double-sided flat thermal emitter 206.

Figure 4D:
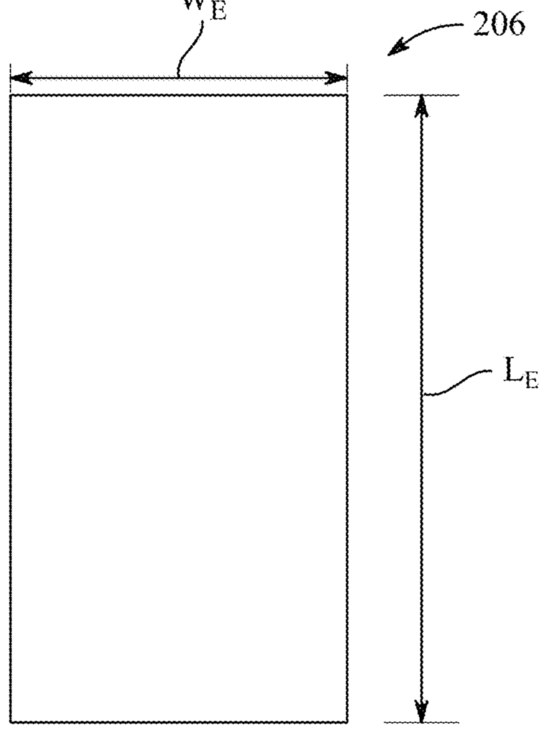
FIG. 4D is a schematic diagram of a side view of the PDMS-coated aluminum double-sided flat thermal emitter, according to certain embodiments.

Referring to FIG. 4D, illustrated is a schematic diagram of a front view of the PDMS-coated aluminum double-sided flat thermal emitter 206. In a non-limiting example, the PDMS-coated aluminum double-sided flat thermal emitter 206 has a width '$W_E$' of about 80 mm and the length '$L_E$' of about 140 mm from the floor 106 of the thermally insulated box 102.

Figure 5:
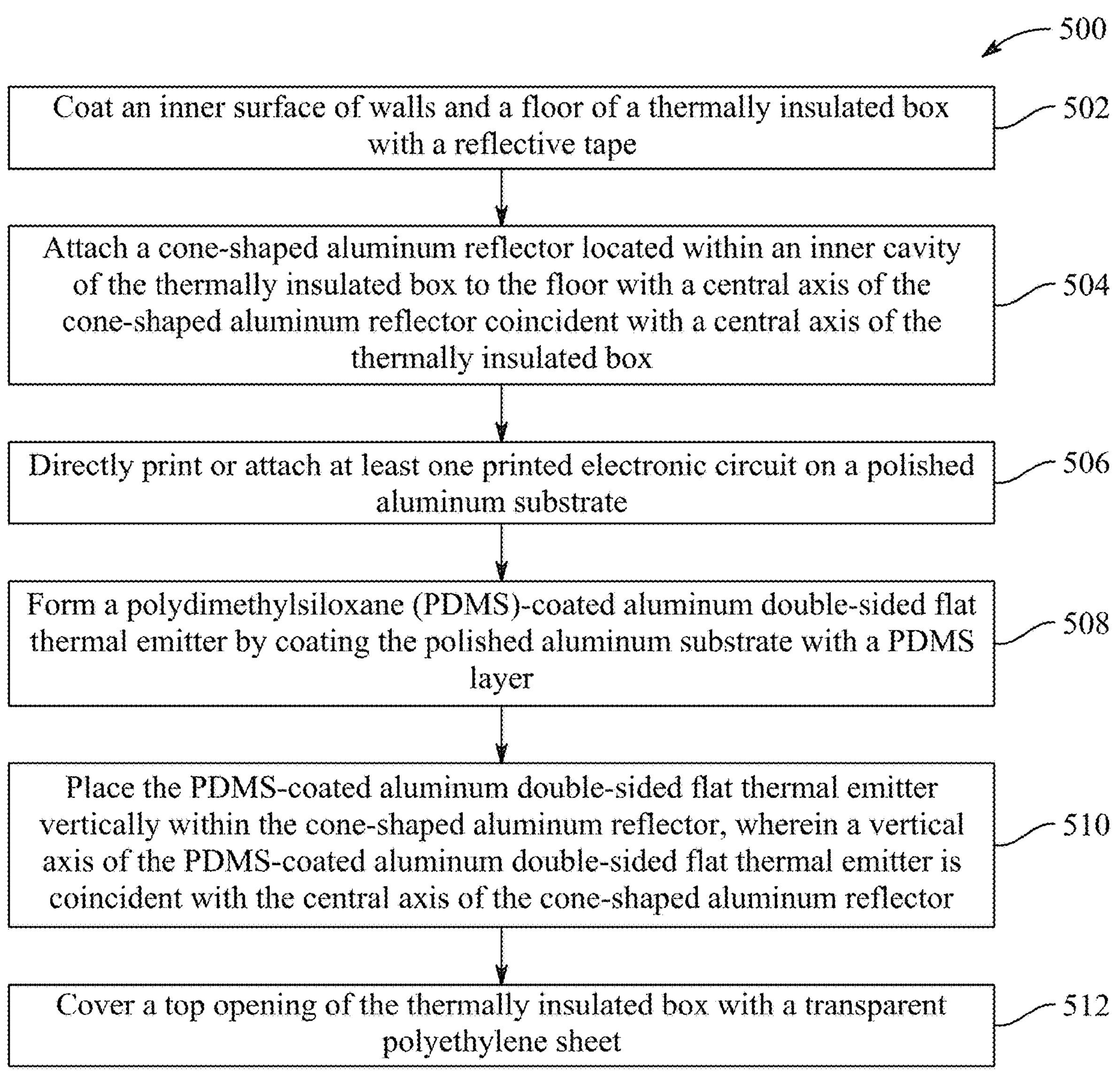
FIG. 5 is an exemplary flowchart of a method of making the passive radiative cooling system for cooling at least one printed electronic circuit, according to certain embodiments.

Referring to FIG. 5, illustrated is an exemplary flowchart of a method 500 of making the passive radiative cooling system 100 for cooling the at least one printed electronic circuit 310.

At step 502, the method 500 includes coating the inner surface 108 of the walls 104 and the floor 106 of the thermally insulated box 102 with the reflective tape 110. The reflective tape 110 is adhered to the walls 104 and the floor 106 of the thermally insulated box 102 to minimize radiative heat transfer from surrounding surfaces. The reflective tape 110 may be manufactured using a material with high reflectivity in both the solar and mid-infrared spectrum, thereby reducing undesired heat absorption by the enclosed components. The reflective tape 110 enhances the efficiency of the passive radiative cooling system 100.

At step 504, the method 500 includes attaching the cone-shaped aluminum reflector 202 located within the inner cavity 204 of the thermally insulated box 102 to the floor 106 with the central axis $A_{x1}$ of the cone-shaped aluminum reflector 202 coincident with the central axis $A_{x2}$ of the thermally insulated box 102. The axial alignment ensures symmetric distribution of reflected thermal radiation and redirects incident sunlight away from the PDMS-coated aluminum double-sided flat thermal emitter 206. The cone-shaped aluminum reflector 202 is fixedly mounted on the floor 106 to provide stable positioning during operation.

At step 506, the method 500 includes directly printing or attaching the at least one printed electronic circuit 310 on the polished aluminum substrate 304. The method 500 further includes directly printing the at least one printed electronic circuit 310 on at least one of the first side 304A and the second side 304B of the polished aluminum substrate 304. Each printed electronic circuit 310 includes at least one contact pad 404 configured for connecting to at least one of a power source 406 and an input/output line.

In one aspect, to print the at least one printed electronic circuit 310, a material may be selected. The polished aluminum substrate 304 may be paired with a thermally insulating layer and copper foil. The thermally insulating layer and the copper foil may be laminated together using heat and pressure to ensure proper adhesion. A desired pattern of the at least one printed electronic circuit 310 may be then printed onto the copper foil using protective ink, followed by etching to remove exposed copper and retain the circuit pattern. Precision drilling may be used to create holes for the plurality of vias 408 using CNC machines. A surface finish may be applied to protect the at least one printed electronic circuit 310 and enhance solderability. Further, a solder mask may be applied over the at least one printed electronic circuit 310, leaving openings only where soldering occurs, followed by silkscreen printing of reference designators. The at least one printed electronic circuit 310 may undergo electrical testing to verify circuit integrity, followed by cutting, profiling to the desired shape, and final visual inspection to ensure compliance with quality standards.

At step 508, the method 500 further includes forming the polydimethylsiloxane (PDMS)-coated aluminum double-sided flat thermal emitter 206 by coating the polished aluminum substrate 304 with the PDMS layer 306. The polished aluminum substrate 304 having the thickness 'L1' of about 0.5 mm, provides structural support and thermal conductivity.

In an aspect, the PDMS layer 306 may be prepared using a Sylgard 184 silicone elastomer. The silicone elastomer may be mixed with a curing agent in a weight ratio of approximately 10:1, creating a homogeneous mixture suitable for application. The PDMS coating 306 is then applied to both the first side 304A and the second side 304B of the polished aluminum substrate 304 to form the first PDMS layer 306A and the second PDMS layer 306B, respectively. Each PDMS layer 306 is deposited to achieve the thickness 'L2' of approximately 120 microns, ensuring optimal mid-infrared emissivity while maintaining mechanical durability.

The PDMS layer 306 is applied to the first side 304A and the second side 304B of the polished aluminum substrate 304 to enhance mid-infrared emissivity. The PDMS layer 306 provides efficient thermal radiation emission in the atmospheric transparency window while maintaining visible light transparency. This composite structure creates a dual-functionality of the PDMS-coated aluminium double-sided flat thermal emitter 206 that is capable of dissipating heat through radiative transfer from both exposed surfaces simultaneously.

At step 510, the method 500 further includes placing the PDMS-coated aluminum double-sided flat thermal emitter 206 vertically within the cone-shaped aluminum reflector 202. The vertical axis $A_{v1}$ of the PDMS-coated aluminum double-sided flat thermal emitter 206 is coincident with the central axis a of the cone-shaped aluminum reflector 202.

The cone-shaped aluminum reflector 202 surrounds the vertically positioned PDMS-coated aluminum double-sided flat thermal emitter 206, redirecting incident solar radiation away from the surface of the PDMS-coated aluminum double-sided flat thermal emitter 206 while allowing unobstructed thermal radiation emission toward the transparent polythene sheet 208 and to the atmosphere.

At step 512, the method 500 includes covering the top opening 210 of the thermally insulated box 102 with the transparent polyethylene sheet 208. The transparent polyethylene sheet 208 is positioned on the top opening 210 to enclose the inner cavity 204 while providing optical transparency in the visible spectrum and high transmissivity in the mid-infrared range. The transparent polyethylene sheet 208 minimizes convective heat exchange with ambient air while permitting thermal radiation to pass through toward the sky. The transparent polyethylene sheet 208 functions as a radiative window for passive cooling.

The method 500 further includes coating the first PDMS layer 306A on the first side 304A of the polished aluminum substrate 304. The first PDMS layer 306A is about 120 microns thick 'L1'. The method 500 further includes curing the first PDMS layer 306A for about 60 minutes at 100 degrees Celsius. The method 500 further includes coating the second PDMS layer 306B on the second side 304B of the polished aluminum substrate 304. The second PDMS layer 306B is about 120 microns thick 'L2'. The method 500 further includes curing the second PDMS layer 306B for about 60 minutes at 100 degrees Celsius. The dual-sided PDMS layer 306 configuration enhances the radiative cooling efficiency by maximizing thermal emission across both surfaces of the polished aluminum substrate 304 while maintaining structural integrity.

The method 500 further includes forming a via in each PDMS layer 306 over each contact pad 404; and connecting, by wires 410, each contact pad 404 to one of an external power source 406 and an external input/output controller. The plurality of vias 408 may be formed using laser ablation or mechanical drilling techniques to create precise openings through the PDMS material, thereby exposing the underlying contact pads 404. The plurality of wiring 410 provides electrical interconnection that enables real-time temperature monitoring and data acquisition within the passive radiative cooling system 100.

The method 500 further includes attaching the at least one printed electronic circuit 310 to at least one of a first side 304A and a second side 304B of the polished aluminum substrate 304. Each printed electronic circuit 310 includes at least one contact pad 404 configured for connecting to at least one of a power source 406 and an input/output line. The at least one printed electronic circuit 310 may be attached using thermally conductive adhesives or mechanical fastening means to ensure secure bonding and efficient thermal coupling between the at least one printed electronic circuit 310 and the polished aluminum substrate 304. The at least one power source 406 is connected to the at least one printed electronic circuit 310 via the plurality of wiring 410.

In a second aspect, the method 500 further includes coating the first PDMS layer 306A on the first side 304A of the polished aluminum substrate 304 and the attached printed circuit 310. The first PDMS layer 306A is about 120 microns thick 'L2'. The method 500 includes curing the first PDMS layer 306A for about 60 minutes at 100 degrees Celsius. The method 500 further includes coating the second PDMS layer 306B on the second side 304B of the polished aluminum substrate 304. The second PDMS layer is about 120 microns thick 'L2'. and curing the second PDMS layer 306B for about 60 minutes at 100 degrees Celsius. The coating of the first PDMS layer 306A and the second PDMS layer 306B enhances the thermal emissivity within the atmospheric transparency window.

In another aspect, the method 500 further includes forming a via in each PDMS layer 306 over each contact pad 404; and connecting, by wires 410, each contact pad 404 to at least one of an external power source 406 and an external input/output controller. The plurality of vias 408 may be formed to create precise openings through the PDMS layer 306 to expose the at least one contact pads 404. The plurality of wiring 410 provide electrical interconnection for real-time temperature monitoring and data acquisition within the passive radiative cooling system 100.

Figure 6A:
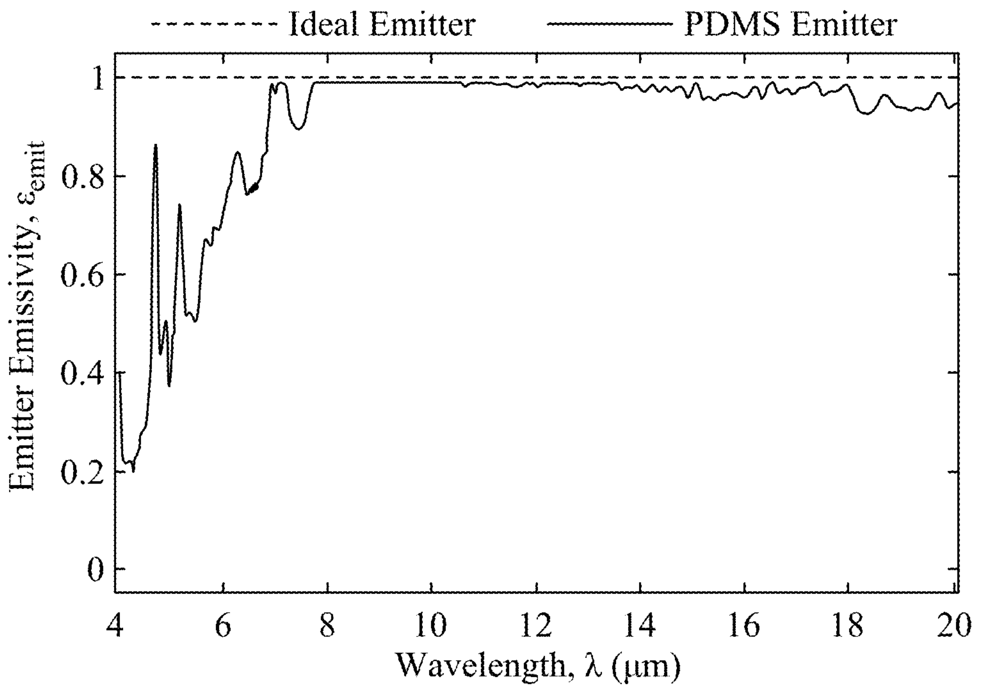
FIG. 6A is a schematic graph illustrating emissivity characteristics of the PDMS-coated aluminum double-sided flat thermal emitter, according to certain embodiments.

Referring to FIG. 6A, illustrated is a schematic graph depicting emissivity characteristics of the PDMS-coated aluminum double-sided flat thermal emitter 206. Within the critical infrared wavelength range of about 8 μm to about 13 μm, the PDMS-coated aluminum double-sided flat thermal emitter 206 demonstrates emissivity of approximately one (~1), indicating high efficiency in radiative heat transfer. This property is essential for effective thermal emission in passive radiative cooling applications.

Figure 6B:
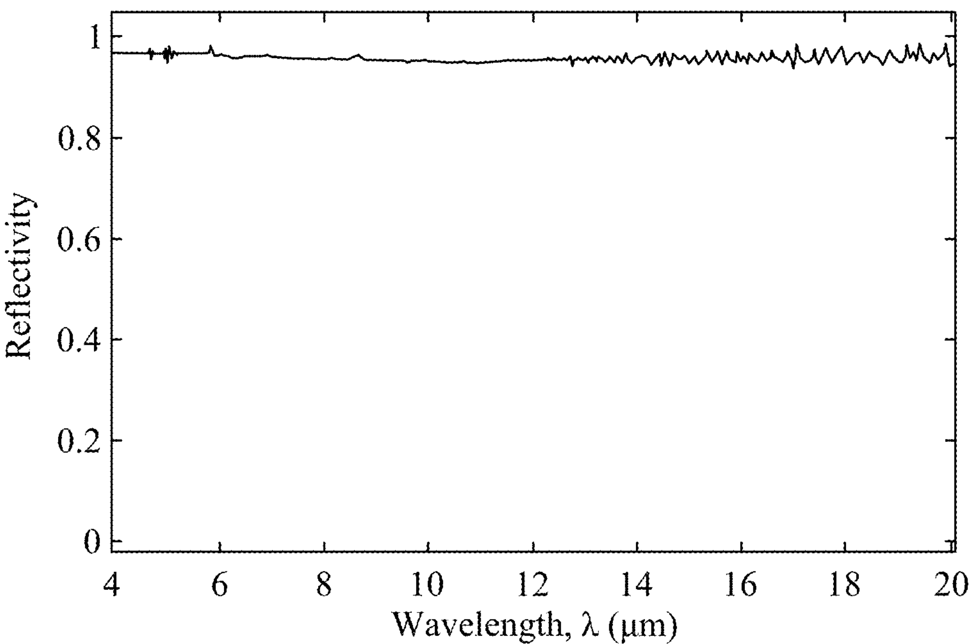
FIG. 6B is a schematic graph illustrating reflectivity characteristics of a cone-shaped aluminum reflector, according to certain embodiments.

Referring to FIG. 6B, illustrated is a schematic graph depicting reflectivity characteristics of the cone-shaped aluminum reflector 202. Within the wavelength range of about 8 μm to about 13 μm, the cone-shaped aluminum reflector 202 exhibits reflectivity of approximately one (~1), which ensures minimal absorption and maximum reflection of thermal radiation. This high reflectivity complements the performance of the PDMS-coated aluminum double-sided flat thermal emitter 206 by directing radiative energy appropriately.

Figures 7, 8:
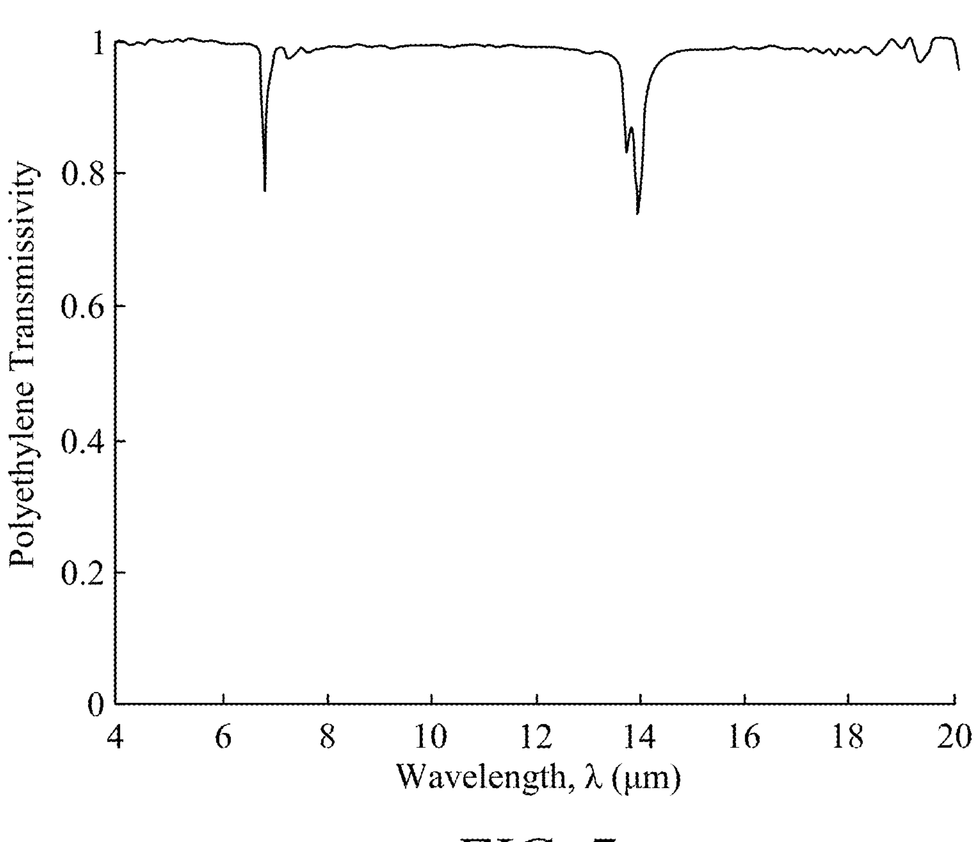
FIG. 7 is a schematic graph illustrating transmissivity characteristics of a transparent polyethylene sheet, according to certain embodiments.
FIG. 8 is a schematic graph illustrating the variation in Relative Humidity (RH) for testing the passive radiative cooling system, according to certain embodiments.

Referring to FIG. 7, illustrated is a schematic graph depicting transmissivity characteristics of the transparent polyethylene sheet 208. Within the wavelength range of about 8 μm to about 13 μm, the transparent polyethylene sheet 208 exhibits nearly perfect transmissivity one (~1).

Referring to FIG. 8, illustrated, is a schematic graph of a variation in Relative Humidity (RH) for testing the passive radiative cooling system 100. The data reveals that the relative humidity during the second night ranged between 55% and 70%, notably higher than the range of 45% to 70% of the first night. These variations in atmospheric moisture content, along with the clearness index, represent critical environmental parameters for assessing performance under different conditions. The variation in relative humidity affects the atmospheric emissivity and consequently influences the radiative cooling performance of the passive radiative cooling system 100.

Figure 9:
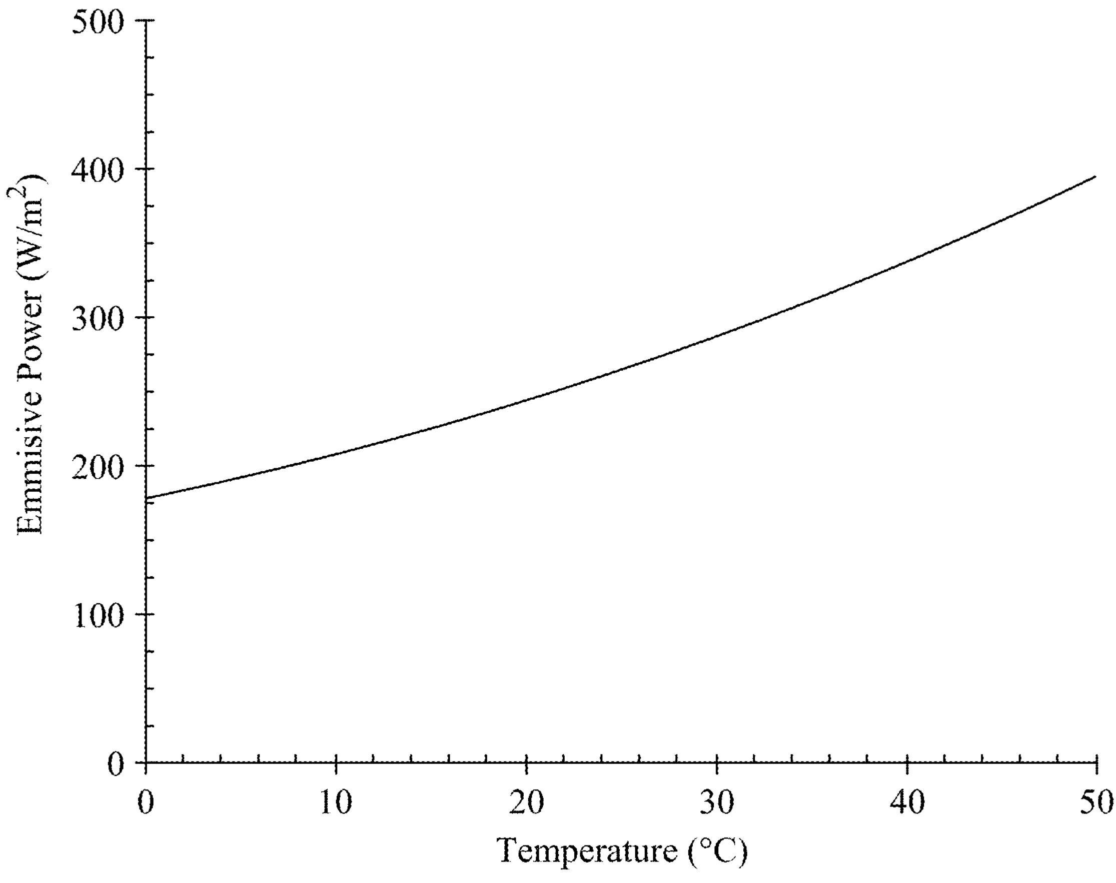
FIG. 9 is a schematic graph illustrating a calculated cooling power of the passive radiative cooling system, according to certain embodiments.

Referring to FIG. 9, illustrated is a schematic graph depicting a calculated cooling power of the passive radiative cooling system 100. Under ideal conditions, assuming $T=T_a$ and no air movement, the passive radiative cooling system 100 experiences zero convective and non-radiative heat losses ($h_{cc}=0$). Under these conditions, the vertical design achieves a cooling power of 280 W/m$^2$ at 25° C., making the passive radiative cooling system 100, effective for dry climates.

Figure 10A:
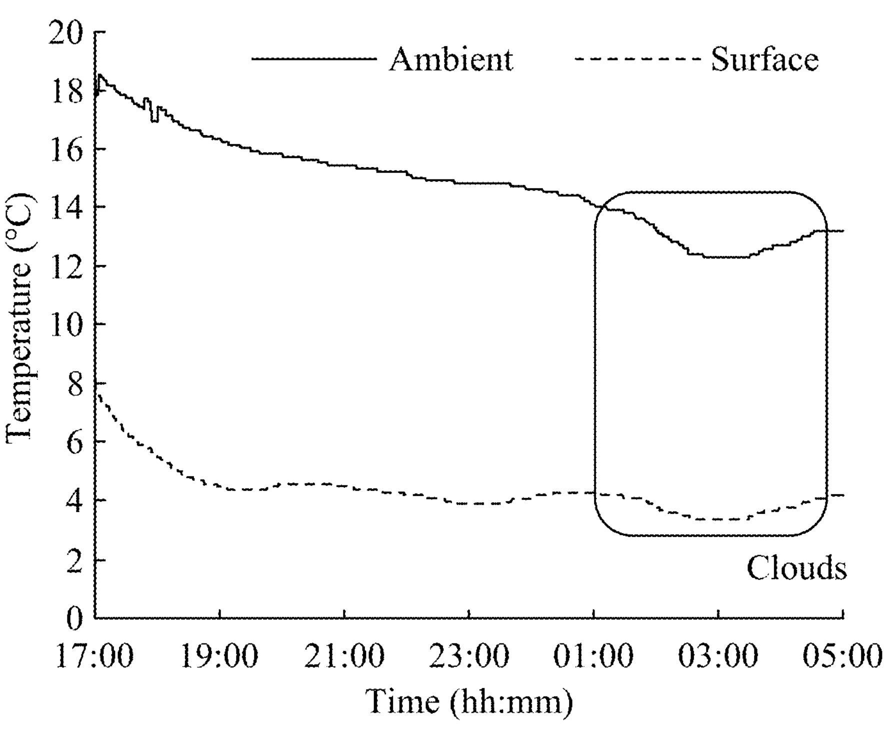
FIG. 10A is a schematic graph illustrating the variation in ambient temperature and flat surface temperature of the PDMS-coated aluminum double-sided flat thermal emitter on a first day according to certain embodiments.

Referring to FIG. 10A, illustrated is a schematic graph depicting variation in ambient temperature and surface temperature of the PDMS-coated aluminum double-sided flat thermal emitter 206 on a first day. During the first day of testing, the passive radiative cooling system 100 maintained a temperature difference of about 9° C. below ambient. Under clear sky conditions, when radiative cooling became more effective, the temperature differential increased further, reaching over 10° C. for the inner surface and 10.9° C. for the outer surface. These results demonstrate the ability of the vertical the PDMS-coated aluminum double-sided flat thermal emitter 206 configurations to consistently achieve sub-ambient cooling through enhanced thermal radiation to the night sky.

Figure 10B:
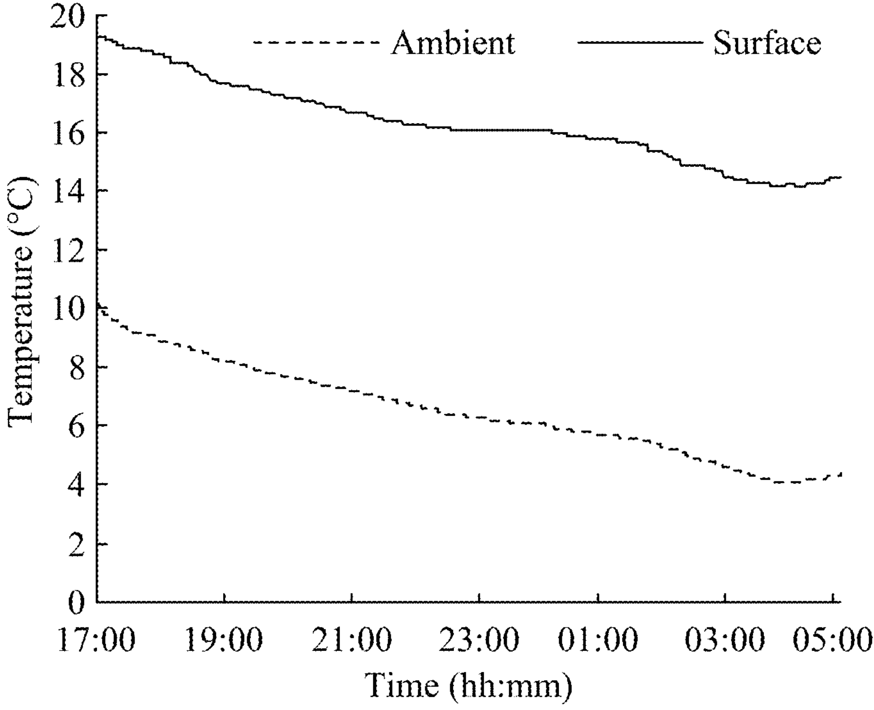
FIG. 10B is a schematic graph illustrating the variation in ambient temperature and the flat surface temperature of the PDMS-coated aluminum double-sided flat thermal emitter on a second day, according to certain embodiments.

Referring to FIG. 10B, illustrated is a schematic graph of variation in ambient and the flat surface of the PDMS-coated aluminum double-sided flat thermal emitter 206 on a second day. During the second day of testing, the passive radiative cooling system 100 maintained a temperature difference of about 10° C. below ambient. The cooling performance of the passive radiative cooling system 100 may be further enhanced by using a spectrally selective mirror. The PDMS-coated aluminum double-sided flat thermal emitter 206 may be designed to work within the atmospheric transparency window wavelength range of about 8 μm to about 13 μm.

In one aspect, a passive radiative cooling system 100 for cooling printed electronic circuits, comprising; a thermally insulated box 102 having walls 104 and a floor 106, wherein an inner surface 108 of the walls 104 and the floor 106 is coated with a reflective tape 110; a cone-shaped aluminum reflector 202 located within an inner cavity 204 of the thermally insulated box 102, wherein the cone-shaped aluminum reflector 202 is attached to the floor 106 and has a central axis $A_{x1}$ coincident with a central axis $A_{x2}$ of the thermally insulated box 102; a polydimethylsiloxane (PDMS)-coated aluminum double-sided flat thermal emitter 206 placed vertically within the cone-shaped aluminum reflector 202, wherein a vertical axis $A_{v1}$ of the PDMS-coated aluminum double-sided flat thermal emitter 206 is coincident with the central axis $A_{x1}$ of the cone-shaped aluminum reflector 202; at least one printed electronic circuit 310 directly printed on or attached to a polished aluminum substrate 304 of the PDMS-coated aluminum double-sided flat thermal emitter 206; and a transparent polyethylene sheet 208 configured to cover a top opening 210 of the thermally insulated box 102.

In an aspect, the passive radiative cooling system 100 is configured to reduce a temperature within the thermally insulated box 102 by an average of about 10 degrees Celsius below an ambient temperature which surrounds the thermally insulated box 102.

In an aspect, the PDMS-coated aluminum double-sided flat thermal emitter 206 is configured to emit heat within an atmospheric transparency window wavelength having a range of about 8 μm to about 13 μm.

In an aspect, the thermally insulated box 102 is made from polystyrene foam 302; the polystyrene foam 302 has a thickness 'T1' of about 10 mm; has a rectangular cuboid shape of about 500 mm by about 400 mm by about 300 mm; and has an open top end.

In an aspect, a frustum angle 'A' of the cone-shaped aluminum reflector 202 is about 45 degrees.

In an aspect, the PDMS-coated aluminum double-sided flat thermal emitter 206 is fabricated from the polished aluminum substrate 304 coated with a PDMS layer 306 on each of a first side 304A and a second side 304B, wherein the polished aluminum substrate 304 is about 0.5 mm in thickness 'L1'.

In an aspect, the PDMS-coated aluminum double-sided flat thermal emitter 206 is mounted within the thermally insulated box 102 with the first side 304A and the second side 304B facing the cone-shaped aluminum reflector 202;

and the PDMS-coated aluminum double-sided flat thermal emitter 206 is attached to the floor 106 by a high-temperature silicone adhesive.

In an aspect, a length '$L_E$' of the PDMS-coated aluminum double-sided flat thermal emitter 206 is equal to a height '$L_C$' of the cone-shaped aluminum reflector 202 as measured from the floor 106 of the thermally insulated box 102 to an upper rim 202A of the cone-shaped aluminum reflector 202.

In an aspect, the PDMS-coated aluminum double-sided flat thermal emitter 206 has a width '$W_E$' of about 80 mm and the length '$L_E$' is about 140 mm from the floor 106 of the thermally insulated box 102.

In an aspect, the at least one printed electronic circuit 310 is directly printed on at least one of the first side 304A and the second side 304B of the polished aluminum substrate 304, wherein each printed electronic circuit 310 includes at least one contact pad 404 configured for connection to at least one of a power source 406 and an input/output line; a first PDMS layer 306A is coated on the first side 304A of the polished aluminum substrate 304, wherein the first PDMS layer 306A is about 120 microns thick 'L2', wherein the first PDMS layer 306A is cured on the first side 304A for about 60 minutes at 100 degrees Celsius; and a second PDMS layer 306B is coated on the second side 304B of the polished aluminum substrate 304, wherein the second PDMS layer 306B is about 120 microns thick, wherein the second PDMS layer 306B is cured on the second side 304B for about 60 minutes at 100 degrees Celsius.

In an aspect, a plurality of vias 408 formed in each PDMS layer 306 to expose the at least one contact pad 404; and a plurality of wiring 410 configured to connect each contact pad 404 to at least one of an external power source 406 and an external input/output controller.

In an aspect, the at least one printed electronic circuit 310 is attached to at least one of the first side 304A and the second side 304B of the polished aluminum substrate 304, wherein each printed electronic circuit 310 includes at least one contact pad 404 configured for connection to at least one of a power source 406 and an input/output line; a first PDMS layer 306A is coated on a first side 304A of the polished aluminum substrate 304, wherein the first PDMS layer 306A is about 120 microns thick 'L2', wherein the first PDMS layer 306A is cured on the first side 304A for about 60 minutes at 100 degrees Celsius; and a second PDMS layer 306B is coated on a second side 304B of the polished aluminum substrate 304, wherein the second PDMS layer 306B is about 120 microns thick 'L2', wherein the second PDMS layer 306B is cured on the second side 304B for about 60 minutes at 100 degrees Celsius.

In an aspect, a plurality of vias 408 formed in each PDMS layer 306 to expose the at least one contact pad 404; and a plurality of wiring 410 configured to connect each contact pad 404 to at least one of an external power source 406 and an external input/output controller.

In second embodiment, a method 500 of making the passive radiative cooling system 100 for cooling the at least one printed electronic circuit 310 comprising: coating the inner surface 108 of the walls 104 and the floor 106 of the thermally insulated box 102 with the reflective tape 110; attaching the cone-shaped aluminum reflector 202 located within the inner cavity 204 of the thermally insulated box 102 to the floor 106 with the central axis $A_{x1}$ of the cone-shaped aluminum reflector 202 coincident with the central axis $A_{x2}$ of the thermally insulated box 102; directly printing or attaching at least one printed electronic circuit 310 on a polished aluminum substrate 304; forming the polydimethylsiloxane (PDMS)-coated aluminum double-sided flat thermal emitter 206 by coating the polished aluminum substrate 304 coated with the PDMS layer 306; placing the PDMS-coated aluminum double-sided flat thermal emitter 206 vertically within the cone-shaped aluminum reflector 202, wherein the vertical axis $A_{v1}$ of the PDMS-coated aluminum double-sided flat thermal emitter 206 is coincident with the central axis $A_{x1}$ of the cone-shaped aluminum reflector 202; covering a top opening 210 of the thermally insulated box 102 with a transparent polyethylene sheet 208.

In an aspect, directly printing the at least one printed electronic circuit 310 on at least one of the first side 304A and the second side 304B of the polished aluminum substrate 304, wherein each printed electronic circuit 310 includes at least one contact pad 404 configured for connecting to at least one of a power source 406 and an input/output line.

In an aspect, coating the first PDMS layer 306A on the first side 304A of the polished aluminum substrate 304, the first PDMS layer 306A is about 120 microns thick; curing the first PDMS layer 306A for about 60 minutes at 100 degrees Celsius; coating a second PDMS layer 306B on the second side 304B of the polished aluminum substrate 304, wherein the second PDMS layer is about 120 microns thick; and curing the second PDMS layer 306B for about 60 minutes at 100 degrees Celsius.

In an aspect, forming a via in each PDMS layer 306 over each contact pad 404; and connecting, by wires 410, each contact pad 404 to one of an external power source 406 and an external input/output controller.

In an aspect, attaching the at least one printed electronic circuit 310 to at least one of a first side 304A and a second side 304B of the polished aluminum substrate 304, wherein each printed electronic circuit 310 includes at least one contact pad 404 configured for connecting to at least one of a power source 406 and an input/output line.

In an aspect, coating the PDMS layer 306 by coating the first PDMS layer 306A on the first side 304A of the polished aluminum substrate 304, wherein the first PDMS layer 306A is about 120 microns thick 'L2'; curing the first PDMS layer 306A for about 60 minutes at 100 degrees Celsius; coating a second PDMS layer 306B on the second side 304B of the polished aluminum substrate 304, wherein the second PDMS layer 306B is about 120 microns thick 'L2'; and curing the second PDMS layer 306B for about 60 minutes at 100 degrees Celsius.

In an aspect, forming a via in each PDMS layer 306 over each contact pad 404; and connecting, by wires 410, each contact pad 404 to at least one of an external power source 406 and an external input/output controller.

The passive radiative cooling system can be utilized for the passive thermal management of outdoor Internet-of-Things (IoT) devices, autonomous sensor nodes, or wearable electronics operating in high-temperature environments. In a non-limiting example, multiple printed electronic circuits fabricated directly on the PDMS-coated aluminum emitter may function collaboratively, such as one circuit for environmental sensing, another for signal processing, and another for wireless transmission. During operation, the integrated thermal emitter dissipates the heat generated by these circuits through passive radiative cooling within the 8-13 μm atmospheric transparency window, maintaining optimal device performance without active cooling components or external power input.

The passive radiative cooling enclosure extends the practical relevance of radiative cooling by integrating functional electronic circuits directly onto a PDMS-coated metallic emitter, combined with a cone-shaped aluminum reflector geometry that enhances directional radiative heat loss. This allows multiple circuits on a single emitter to perform complex operations, such as sensing, computation, and communication, while the system self-regulates its temperature, offering an energy-independent solution for smart-city infrastructure, environmental monitoring, and compact outdoor electronics.

Numerous modifications and variations of the present disclosure are possible in light of the above teachings. It is therefore to be understood that within the scope of the appended claims, the invention may be practiced otherwise than as specifically described herein.

The invention claimed is:

1. A passive radiative cooling system for cooling a printed electronic circuit, comprising;
- a thermally insulated box having walls and a floor, wherein an inner surface of the walls and the floor are coated with a reflective tape;
- a cone-shaped aluminum reflector located within an inner cavity of the thermally insulated box, wherein the cone-shaped aluminum reflector is attached to the floor and has a central axis coincident with a central axis of the thermally insulated box;
- a polydimethylsiloxane (PDMS)-coated aluminum double-sided flat thermal emitter placed vertically within the cone-shaped aluminum reflector, wherein a vertical axis of the PDMS-coated aluminum double-sided flat thermal emitter is coincident with the central axis of the cone-shaped aluminum reflector;
- at least one printed electronic circuit directly printed on or attached to a polished aluminum substrate of the PDMS-coated aluminum double-sided flat thermal emitter; and
- a transparent polyethylene sheet configured to cover a top opening of the thermally insulated box.

2. The passive radiative cooling system of claim 1, wherein the passive radiative cooling system is configured to reduce a temperature within the thermally insulated box by an average of about 10 degrees Celsius below an ambient temperature which surrounds the thermally insulated box.

3. The passive radiative cooling system of claim 2, wherein the PDMS-coated aluminum double-sided flat thermal emitter is configured to emit heat within an atmospheric transparency window wavelength having a range of about 8 μm to about 13 μm.

4. The passive radiative cooling system of claim 1, wherein the thermally insulated box:
- is made from polystyrene foam;
- the polystyrene foam has a thickness of about 10 mm;
- has a rectangular cuboid shape of about 500 mm by about 400 mm by about 300 mm; and
- has an open top end.

5. The passive radiative cooling system of claim 1, wherein a frustum angle of the cone-shaped aluminum reflector is about 45 degrees.

6. The passive radiative cooling system of claim 1, wherein the PDMS-coated aluminum double-sided flat thermal emitter is fabricated from the polished aluminum substrate coated with a PDMS layer on each of a first side and a second side, wherein the polished aluminum substrate is about 0.5 mm in thickness.

7. The passive radiative cooling system of claim 6, wherein:
- the PDMS-coated aluminum double-sided flat thermal emitter is mounted within the thermally insulated box with the first side and the second side facing the cone-shaped aluminum reflector; and
- the PDMS-coated aluminum double-sided flat thermal emitter is attached to the floor by a high-temperature silicone adhesive.

8. The passive radiative cooling system of claim 7, wherein a length of the PDMS-coated aluminum double-sided flat thermal emitter is equal to a height of the cone-shaped aluminum reflector as measured from the floor of the thermally insulated box to an upper rim of the cone-shaped aluminum reflector.

9. The passive radiative cooling system of claim 8, wherein the PDMS-coated aluminum double-sided flat thermal emitter has a width of about 80 mm and the length is about 140 mm from the floor of the thermally insulated box.

10. The passive radiative cooling system of claim 6, wherein:
- the at least one printed electronic circuit is directly printed on at least one of the first side and the second side of the polished aluminum substrate, wherein each printed electronic circuit includes at least one contact pad configured for connection to at least one of a power source and an input/output line;
- a first PDMS layer is coated on the first side of the polished aluminum substrate, wherein the first PDMS layer is about 120 microns thick, wherein the first PDMS layer is cured on the first side for about 60 minutes at 100 degrees Celsius; and
- a second PDMS layer is coated on the second side of the polished aluminum substrate, wherein the second PDMS layer is about 120 microns thick, wherein the second PDMS layer is cured on the second side for about 60 minutes at 100 degrees Celsius.

11. The passive radiative cooling system of claim 10, further comprising:
- a plurality of vias formed in each PDMS layer to expose each one of the at least one contact pad; and
- a plurality of wiring configured to connect each contact pad to at least one of an external power source and an external input/output controller.

12. The passive radiative cooling system of claim 6, wherein:
- the at least one printed electronic circuit is attached to at least one of the first side and the second side of the polished aluminum substrate, wherein each printed electronic circuit includes at least one contact pad configured for connection to at least one of a power source and an input/output line;
- a first PDMS layer is coated on a first side of the polished aluminum substrate, wherein the first PDMS layer is about 120 microns thick, wherein the first PDMS layer is cured on the first side for about 60 minutes at 100 degrees Celsius; and
- a second PDMS layer is coated on a second side of the polished aluminum substrate, wherein the second PDMS layer is about 120 microns thick, wherein the second PDMS layer is cured on the second side for about 60 minutes at 100 degrees Celsius.

13. The passive radiative cooling system of claim 12, further comprising:
- a plurality of vias formed in each PDMS layer to expose each one of the at least one contact pad; and
- a plurality of wiring configured to connect each contact pad to at least one of an external power source and an external input/output controller.

14. A method of making a passive radiative cooling system for cooling at least one printed electronic circuit, comprising;

coating an inner surface of walls and a floor of a thermally insulated box with a reflective tape;

attaching a cone-shaped aluminum reflector located within an inner cavity of the thermally insulated box to the floor with a central axis of the cone-shaped aluminum reflector coincident with a central axis of the thermally insulated box;

directly printing or attaching at least one printed electronic circuit on a polished aluminum substrate;

forming a polydimethylsiloxane (PDMS)-coated aluminum double-sided flat thermal emitter by coating the polished aluminum substrate with a PDMS layer;

placing the PDMS-coated aluminum double-sided flat thermal emitter vertically within the cone-shaped aluminum reflector, wherein a vertical axis of the PDMS-coated aluminum double-sided flat thermal emitter is coincident with the central axis of the cone-shaped aluminum reflector; and covering a top opening of the thermally insulated box with a transparent polyethylene sheet.

15. The method of claim 14, further comprising:

directly printing the at least one printed electronic circuit on at least one of a first side and a second side of the polished aluminum substrate, wherein each printed electronic circuit includes at least one contact pad configured for connecting to at least one of a power source and an input/output line.

16. The method of claim 15, further comprising coating the PDMS layer by:

coating a first PDMS layer on the first side of the polished aluminum substrate, wherein the first PDMS layer is about 120 microns thick;

curing the first PDMS layer for about 60 minutes at 100 degrees Celsius; and coating a second PDMS layer on the second side of the polished aluminum substrate, wherein the second PDMS layer is about 120 microns thick; and curing the second PDMS layer for about 60 minutes at 100 degrees Celsius.

17. The method of claim 16, further comprising:

forming a via in each PDMS layer over each contact pad; and connecting, by wires, each contact pad to one of an external power source and an external input/output controller.

18. The method of claim 14, further comprising:

attaching the at least one printed electronic circuit to at least one of a first side and a second side of the polished aluminum substrate, wherein each printed electronic circuit includes at least one contact pad configured for connecting to at least one of a power source and an input/output line.

19. The method of claim 15, further comprising coating the PDMS layer by:

coating a first PDMS layer on the first side of the polished aluminum substrate, wherein the first PDMS layer is about 120 microns thick;

curing the first PDMS layer for about 60 minutes at 100 degrees Celsius;

coating a second PDMS layer on the second side of the polished aluminum substrate, wherein the second PDMS layer is about 120 microns thick; and curing the second PDMS layer for about 60 minutes at 100 degrees Celsius.

20. The method of claim 19, further comprising:

forming a via in each PDMS layer over each contact pad; and connecting, by wires, each contact pad to at least one of an external power source and an external input/output controller.

* * * * *